United States Patent
Ossimitz et al.

(10) Patent No.: US 9,082,644 B2
(45) Date of Patent: Jul. 14, 2015

(54) METHOD OF MANUFACTURING AND TESTING A CHIP PACKAGE

(71) Applicant: Infineon Technologies AG, Neubiberg (DE)

(72) Inventors: Peter Ossimitz, Munich (DE); Matthias von Daak, Markt Schwaben (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 129 days.

(21) Appl. No.: 13/745,550

(22) Filed: Jan. 18, 2013

(65) Prior Publication Data
US 2014/0206109 A1 Jul. 24, 2014

(51) Int. Cl.
*H01L 21/66* (2006.01)
*G01R 31/28* (2006.01)

(52) U.S. Cl.
CPC ............ *H01L 22/10* (2013.01); *G01R 31/2884* (2013.01); *H01L 2224/16225* (2013.01); *H01L 2224/48091* (2013.01)

(58) Field of Classification Search
None
See application file for complete search history.

(56) References Cited

U.S. PATENT DOCUMENTS

| 5,531,021 | A | * | 7/1996 | Kolman et al. | 29/843 |
| 5,677,566 | A | * | 10/1997 | King et al. | 257/666 |
| 5,982,185 | A | * | 11/1999 | Farnworth | 324/756.02 |
| 6,706,557 | B2 | * | 3/2004 | Koopmans | 438/109 |
| 6,803,303 | B1 | * | 10/2004 | Hiatt et al. | 438/612 |
| 2002/0094602 | A1 | * | 7/2002 | Her et al. | 438/106 |
| 2003/0214029 | A1 | * | 11/2003 | Tao et al. | 257/723 |
| 2004/0150104 | A1 | * | 8/2004 | Terui | 257/734 |
| 2007/0155048 | A1 | * | 7/2007 | Lee et al. | 438/106 |

\* cited by examiner

*Primary Examiner* — Seahvosh Nikmanesh
(74) *Attorney, Agent, or Firm* — Slater & Matsil, L.L.P.

(57) ABSTRACT

A method of producing and testing a chip package is described. The chip package to be produced includes a semiconductor chip containing an integrated circuit and a reinforcing structure attached to the semiconductor chip. Further, the chip package has a lower main face and an upper main face opposite to the lower main face, wherein the lower main face is at least partly formed by an exposed surface of the semiconductor chip and the upper main face is formed by a terminal surface of the reinforcing structure on which external terminal pads of the chip package are arranged. After production, the package is subjected to a package-level burn-in test.

22 Claims, 5 Drawing Sheets

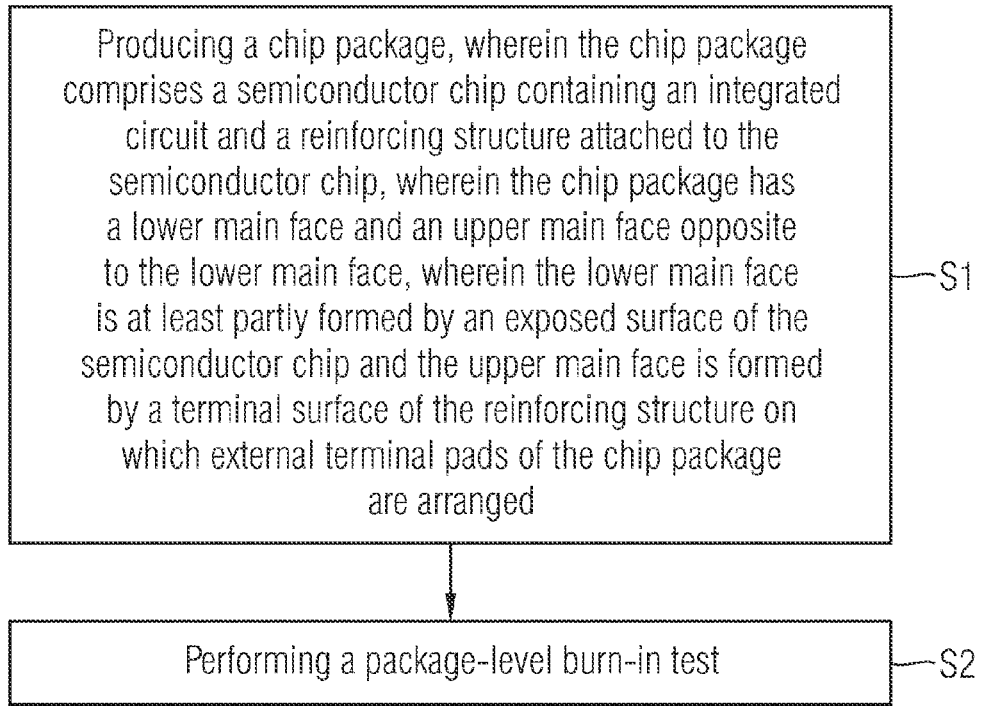
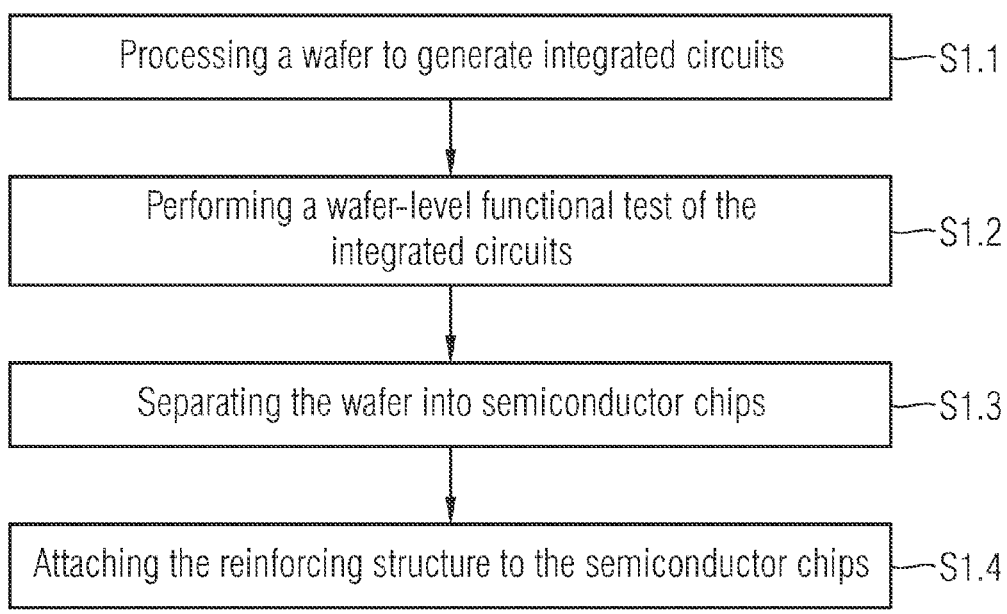

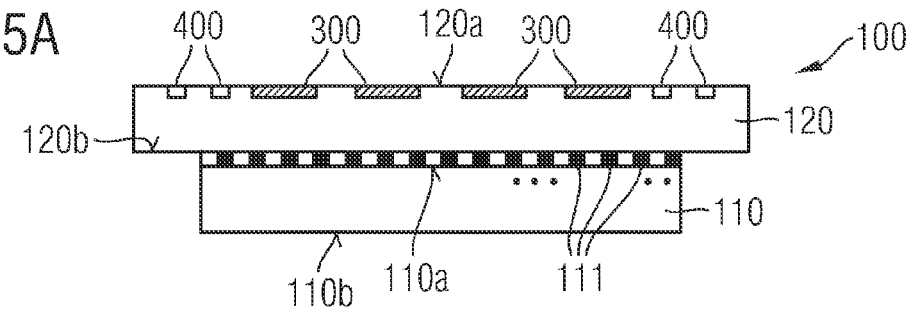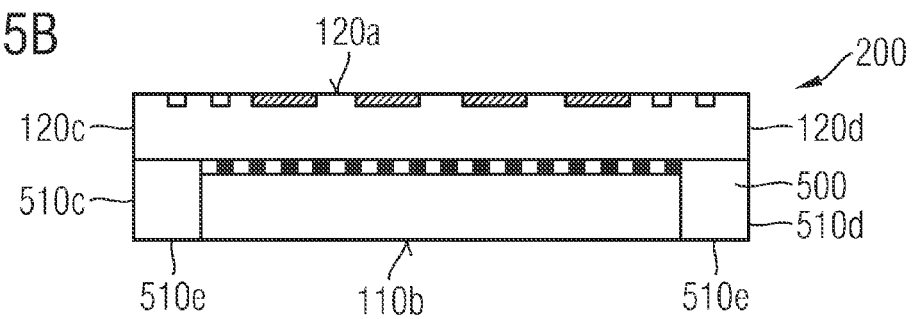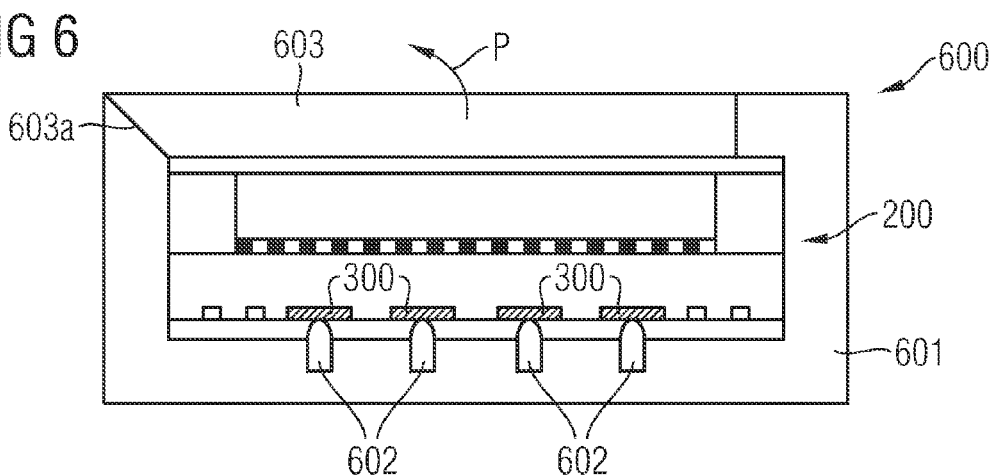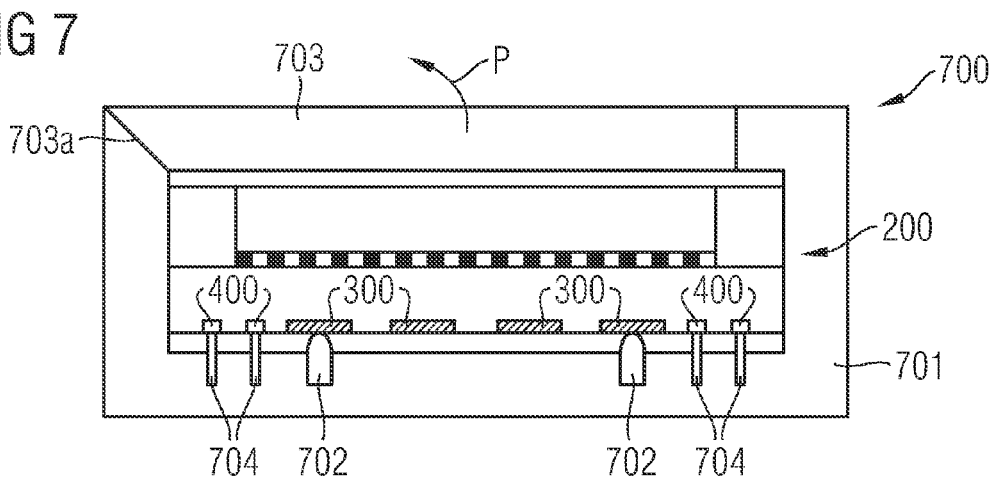

METHOD OF MANUFACTURING AND TESTING A CHIP PACKAGE

TECHNICAL FIELD

The invention relates to electronic devices, and more particularly to the technique of manufacturing and testing of integrated circuit semiconductor chips.

BACKGROUND

Semiconductor device manufacturers are constantly striving to increase the performance of their products, while decreasing their cost of manufacture. Bare die products allow for small form factors and high flexibility for the customer. However, handling of bare dies is more difficult than handling of chip packages due to their sensibility to external impact and small form factors involved. In particular, bare die testing is difficult and some types of tests such as, e.g., burn-in tests are not applicable to bare dies.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a process flow of producing and testing a chip package in accordance with one embodiment;

FIG. 2 shows a process flow of producing a chip package in accordance with one embodiment;

FIG. 5A is a sectional view schematically illustrating a chip package 100 in accordance with one embodiment;

FIG. 5B is a sectional view schematically illustrating a chip package 200 in accordance with one embodiment;

FIG. 6 is a sectional view of an exemplary chip package inserted in a burn-in test socket for performing a burn-in test on package-level;

FIG. 7 is a sectional view of an exemplary chip package inserted in a test socket for performing a functional test on package-level;

DETAILED DESCRIPTION OF ILLUSTRATIVE EMBODIMENTS

Figure 3:
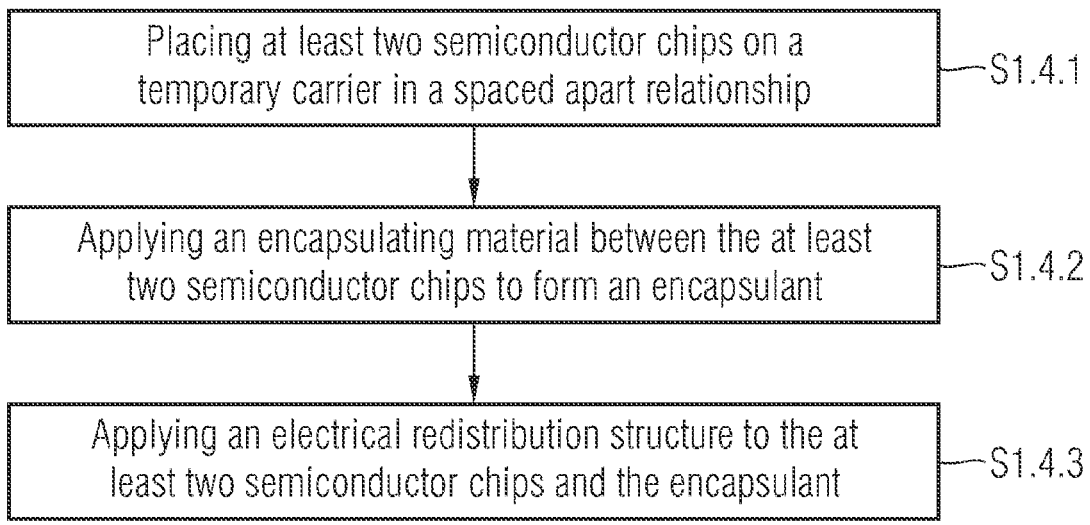
FIG. 3 shows a process flow of attaching a reinforcing structure to semiconductor chips in accordance with one embodiment.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets, chips or substrates in the Figures are not necessarily to scale.

In the following description, reference is made to the accompanying drawings, which form a part thereof, and in which is shown by way of illustration specific embodiments in which the invention may be practiced. In this regard, directional terminology, such as, e.g., "upper," "lower," "top," "bottom," "left-hand," "right-hand," "front side," "backside," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements. However, one of the possible disclosures of the terms "coupled" and/or "electrically coupled" is that of a direct connection without intervening elements between the "coupled" or "electrically coupled" elements.

The semiconductor chips described herein may be of different types, may be manufactured by different technologies and may include for example integrated electrical, electro-optical or electro-mechanical circuits and/or passives. The semiconductor chips may include integrated circuits such as, e.g., logic integrated circuits, control circuits, microprocessors, memory devices, etc. The semiconductor chips need not be manufactured from specific semiconductor material such as for example Si, SiC, SiGe, GaAs, and, furthermore, may contain inorganic and/or organic materials that are not semiconductors, such as for example insulators, plastics or metals.

The semiconductor chip may have chip contact pads (or electrodes) which allow electrical contact to be made with the integrated circuit(s) included in the semiconductor chip. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, NiSn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible.

Devices containing one or more packaged chips are described below. The chip package comprises the semiconductor chip(s) and a reinforcing structure. The reinforcing structure may comprise a package substrate containing an electrical interconnect such as, e.g., a structured redistribution layer. The electrical interconnect is in electrical contact to chip electrodes. Further, the reinforcing structure or, more specifically, the package substrate may comprise the terminal pads of the chip package. The terminal pads of the chip package are electrically connected to the integrated circuit via the electrical interconnect. Thus, the electrical interconnect may serve as an electrical rerouting structure coupling the terminal pads of the chip package to the chip electrodes.

The package substrate may comprise or be made of a polymer material or ceramics. For instance, the package substrate may comprise at least one insulating layer of a polymer material coated with a structured metal foil layer. The structured metal foil layer may be an electrical redistribution layer attached to the insulating layer. The insulating layer may be made on the basis of epoxy resin, polythetrafluoroethylene, aramid fibers or carbon fibers and may include reinforcement means such as fiber mats, for example glass or carbon fibers. By way of example, such package substrate may be a single-layer PCB (printed circuit boards) or a multi-layer PCB. Electrical redistribution structures as described above may be applied by thin-film processing on wafer level. In other embodiments, the package substrate may comprise a plate of ceramics coated with a structured metal layer. By way of example, such package substrates may be DCB (direct copper bonded) ceramics substrates.

The package substrate and the electrical interconnect may be used to produce fan-out type packages. In a fan-out type package at least some of the terminal pads and/or conductor lines of the electrical interconnect connecting the semiconductor chip to the terminal pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the terminal surface area of the package in relation to the footprint of the semiconductor chip, thus leading to relaxed constraints in view of package terminal pad size and pitch with regard to later processing, e.g., board-level system integration (second level assembly).

Further, the reinforcing structure may comprise an encapsulant. The encapsulant may, for example, comprise or be made of a thermoset material or a thermoplastic material. A thermoset material may, e.g., be made on the basis of an epoxy resin. A thermoplastic material may, e.g., comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release. The encapsulant may, e.g., be a mold material or a laminate material. The encapsulant may, e.g., be applied during a process of wafer-level packaging (WLP) or during other packaging processes.

Packages considered herein may be referred to as bare die packages. In bare die packages, the lower (backside) surface of the package may comprise or completely consist of an exposed surface of the semiconductor chip accommodated in the package. Therefore, bare die packages may be mounted to application boards the same way as bare dies. In other words, known bare die mounting technology and adhesives may be used by the customer to attach the bare die package to an application board. Further, the same advantages (e.g., high thermal connectivity between chip and board, high design flexibility) may be obtained as in bare die mounting technology such as, e.g., chip-on-board (COB) technology.

Packages considered herein are tested by the package manufacturer before being shipped to the customer. Basically, testing may be performed on wafer level or on package level. In several cases the test is performed on wafer level and package level. One type of a testing process is referred to as a burn-in test in the art. In burn-in testing, the system to be tested is exposed to elevated temperature for a long period of time (e.g., several hours) and operated to screen "early failures." The explained burn-in testing includes the electrical test of the chip. This can be done on the same equipment and process step as the burn-in test. It can be also a part of a following test of the chip.

Singulated bare dies cannot be subjected to burn-in testing since bare die handling is too difficult in view of their low robustness and in view of the pitch and pad size limitations of chip electrodes. Therefore, if a burn-in test is required for bare die products, it has to be performed on wafer level. Burn-in tests on wafer level, however, are expensive because of the high costs of wafer burn-in equipment. Further, burn-in testing on wafer level is a sophisticated procedure. Therefore, bare die products are often not burn-in tested.

According to FIG. 1, a method of producing and testing a chip package comprises, at S1, producing a chip package, wherein the chip package comprises a semiconductor chip containing an integrated circuit and a reinforcing structure attached to the semiconductor chip. The chip package has a lower main face and an upper main face opposite to the lower main face, wherein the lower main face is at least partly formed by an exposed surface of the semiconductor chip and the upper main face is formed by a terminal surface of the reinforcing structure on which external terminal pads of the chip package are arranged.

That way, due to the lower main face being at least partly formed by an exposed surface of the semiconductor chip, a "quasi bare die"—herein also referred to as a "bare die package"—is designed, which has the same advantageous capabilities as a bare die. However, due to the reinforcing structure, the bare die package can have sufficient robustness to be subjected to a burn-in test. Thus, it is possible to obtain a significantly higher product quality than for bare dies.

At S2, a package-level burn-in test is performed. The package-level burn-in test performed on a bare die package provides for the enhancement of product quality by screening out early failures so that KGD (known good die) packages are identified.

Further, the reinforcing structure may be designed to comprise an electrical redistribution structure. The electrical redistribution structure may be a fan-out structure which relaxes the pitch/pad size limitations of the chip electrodes. More specifically, the electrical redistribution structure may comprise a terminal surface containing the external terminal pads of the package. The pitch and/or pad size of the terminal pads may be larger than the pitch and/or pad size of the chip electrodes. Further, a standardized terminal pad layout may be used and product scalability can be obtained.

According to FIG. 2, a method of producing the chip package may comprise, at S1.1, processing a wafer to generate integrated circuits. Wafer processing may comprise forming transistors and internal wiring in the wafer substrate. Further, wafer processing may comprise forming chip electrodes on an upper surface the wafer.

At S1.2, a first functional test of the integrated circuits may, e.g., be performed on wafer-level. The first functional test may not be a burn-in test, i.e., it is not performed at high temperatures and its duration is comparatively short (e.g., a few seconds). This functional test may consist also of parametric and structural test methods, and is optionally also partitioned in multiple so-called test insertions on wafer and/or package level.

At S1.3, the wafer is separated into semiconductor chips, i.e., bare dies. Separation may be performed by any known dicing technique, e.g., sawing, laser dicing, etc.

At S1.4, the reinforcing structure is attached to the semiconductor chips.

According to FIG. 3, a method of attaching the reinforcing structure may comprise, at S1.4.1, placing at least two semiconductor chips on a temporary carrier in a spaced apart relationship and, at S1.4.2, applying an encapsulating material between the at least two semiconductor chips to form an encapsulant. The encapsulating material may be applied, e.g., by molding or by laminating. Further, attaching the reinforcing structure may comprise, at S1.4.3, applying an electrical redistribution structure to the at least two semiconductor chips and the encapsulant. That way, the encapsulant and/or the electrical redistribution structure may, e.g., be applied during a process of wafer-level packaging (WLP). It is to be noted that the application of an encapsulant is not mandatory, i.e., an electrical redistribution structure can also be applied if no encapsulant has been applied.

Figure 4:
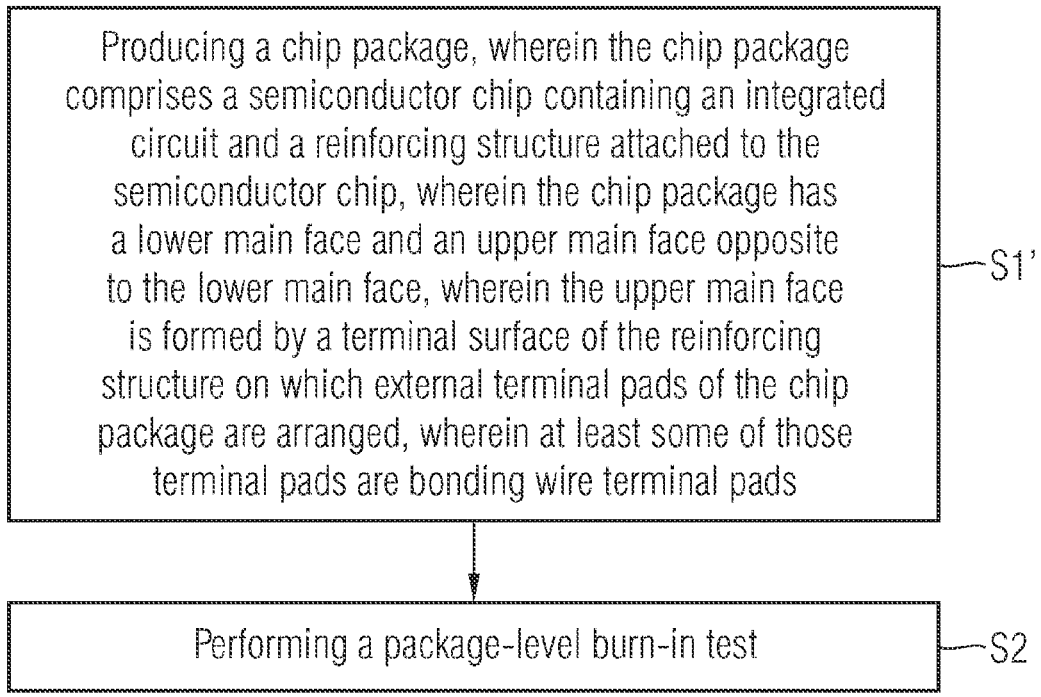
FIG. 4 shows a process flow of producing and testing a chip package in accordance with one embodiment.

According to FIG. 4, a method of producing and testing a chip package comprises, at S1', producing a chip package, wherein the chip package comprises a semiconductor chip containing an integrated circuit and a reinforcing structure attached to the semiconductor chip. The chip package has a lower main face and an upper main face opposite to the lower main face, wherein the upper main face is formed by a terminal surface of the reinforcing structure on which external terminal pads of the chip package are arranged, wherein at least some of these terminal pads are wire-bonding terminal pads. That way, the package is a wire-bond package.

At S2, a package-level burn-in test is performed. The package-level burn-in test performed on a wire-bond package provides for the enhancement of product quality of wire-bond packages by screening out early failures so that KGD (known good die) packages are identified. Often also a functional test is added before the burn-in test. After the package level burn-in test in many cases a further functional test is executed to ensure the electrical parameters of the integrated circuit semiconductor chip before the shipment to the customer.

FIG. 5A illustrates a chip package 100 in accordance with one embodiment described herein. The package 100 comprises a semiconductor chip 110 electrically and mechanically coupled to a package substrate 120. The package substrate 120 forms a reinforcing structure giving robustness to the package 100. The semiconductor chip 110 may have been processed by front-end wafer level technology to contain an integrated circuit. By way of example, the upper surface 110a of the semiconductor chip 110 has been processed so that an active region of the semiconductor chip 110 comprising, e.g., integrated transistors etc. is implemented adjacent to upper surface 110a thereof.

Further, a plurality of chip electrodes 111 may be arranged on the upper surface 110a of the semiconductor chip 110. The chip electrodes 111 are electrically coupled to the integrated circuit of the semiconductor chip 110 via a chip-internal wiring.

The package substrate 120 may have a main upper surface 120a and a main lower surface 120b opposite to the upper surface 120a. The lower surface 120b of the package substrate 120 faces the upper surface 110a of the semiconductor chip 110 and is connected thereto.

The upper surface 120a of the package substrate 120 represents a common terminal surface of the chip package 100 on which terminal pads 300, 400 are arranged. The terminal pads 300, 400 represent the external terminals of the semiconductor chip package 100.

The package substrate 120 comprises an electrical interconnect (not shown) configured to electrically couple individual chip electrodes 111 to individual terminal pads 300, 400 of the package 100. As a person skilled in the art will be aware, a plurality of technologies are available to establish such electrical interconnect, e.g., thin film technology for creating an electrical redistribution structure, vias technology for creating electrical throughputs passing through the package substrate 120, etc. The electrical interconnect (not shown) may be arranged on the upper surface 120a of the package substrate 120, the lower surface 120b of the package substrate 120 or may be provided as an internal electrical interconnect of the package substrate 120 sandwiched between insulating layers thereof. In all these cases, the electrical interconnect may be formed by a structured metal foil and/or the package substrate 120 together with the electrical interconnect may represent an electrical redistribution structure.

The package substrate 120 may, e.g., be an organic substrate, a ceramic substrate, etc. Further, the package substrate 120 may, e.g., be a laminate substrate strip comprising a flexible resin tape, a rigid fiber-glass/copper sheet laminate, a co-fired ceramic substrate, etc.

By way of example, the upper surface 120a of the package substrate 120 may be provided with a first group of terminal pads 300 and a second group of terminal pads 400. As will be explained in more detail in the following, the pad size and/or the pitch of the terminal pads 300 of the first group of terminal pads 300 and the terminal pads 400 of the second group of terminal pads 400 may be different.

The mounting surface of the semiconductor package 100 may be realized by the lower (backside) surface 110b of the bare semiconductor chip 110. Thus, this lower surface 110b of the semiconductor chip 110 may be completely exposed. Semiconductor package 100 may thus be a "bare die package" as is explained in more detail herein. A mounting surface is the surface of the package which, when mounted to an application board, is bonded directly to the application board.

FIG. 5B illustrates a chip package 200. In view of the semiconductor chip 110, the chip electrodes 111, the package substrate 120, the electrical interconnect (not shown) and the terminal pads 300, 400, the chip package 200 may have the same structure and characteristics as chip package 100, and reference is made to the above disclosure to avoid reiteration. Further, chip package 200 may comprise an encapsulant 500. The encapsulant 500 gives robustness to the package 200 and thus forms part of the reinforcing structure attached to the semiconductor chip 110.

The encapsulant 500 may be made of a mold material or a laminate material, e.g., a thermoplastic or thermoset material as mentioned above. The encapsulant 500 may cover a part of or all side faces of the bare semiconductor chip 110. Some or all side faces of the bare semiconductor chip 110 may be completely covered by the encapsulant 500. Only the side faces of the bare semiconductor chip 110 may be covered by the encapsulant 500. Outer side faces 510c and 510d of the encapsulant 500 may be flush with outer side faces 120c, 120d of the package substrate 120, respectively, thus forming corresponding package side faces 120c, 510c and 120d, 510d. Further, the lower (backside) surface 110b of the semiconductor chip 110 may level with the lower package bottom faces 510e of the encapsulant 500. It is to be noted that the encapsulant 500 may not cover the lower (backside) surface 110b of the semiconductor chip 110.

The lower (backside) surface 110b of the semiconductor chip 110 may be completely uncovered, e.g., a bare chip surface may be exposed. In this case, similar to chip package 100, the chip package 200 is a bare die package. Bare die packages such as, e.g., chip package 100 or 200 may be mounted to application boards the same way as bare chips. Thus, known bare die mounting technology and bonding materials (e.g., adhesives) may be used by the customer to attach the bare die package 100, 200 to an application board. Further, as the backside surface 110b of a bare die package such as, e.g., chip package 100 or chip package 200 is identical to the backside surface of a bare die (e.g., semiconductor chip 110), the same high thermal conductivity between bare die package 100, 200 and application board may be obtained as in bare die technology.

It is to be noted that the backside surface 110b may, e.g., be formed by a thin protection layer (not shown) coating the semiconductor material of the semiconductor chip 110, e.g., a hard passivation layer, an oxide layer, a nitride layer or a (thin) polymer layer. The protection layer should be thin and have a high thermal conductivity. That is, the expressions "bare die" and "exposed surface" as used herein may be understood to exclude the encapsulant 500 to cover the backside surface 110b, but may comprise implementations in which a (thin) protection layer is provided to form the backside surface 110b.

The chip package 200 depicted in FIG. 5B or other examples of chip packages considered herein may be manufactured on wafer-level, e.g., by a wafer-level process in which the processed semiconductor chips are cut from a wafer, placed in a space-apart relationship on a temporary carrier, and embedded in an mold material forming the encapsulant 500. The package substrate 120 may then be applied to the so-called "artificial wafer" or "molded reconfigured wafer" formed by the encapsulant 500 and the semiconductor chips 120 distributed therein. Only after applying the encapsulant 500 and the package substrate 120, single packages 200 are cut from the "artificial wafer." Packaging on wafer-level is known in the art to produce so-called wafer-level packages (WLP). Chip packages considered herein, e.g., chip package 200, may, e.g., be a WLP.

Chip packages considered herein may be fan-out type packages as illustrated by way of example in FIGS. 5A and 5B. Fan-out type packages allow the common terminal surface of the package (here, e.g., the upper surface 120a) to extend beyond the outline of the semiconductor chip 110. The first and second terminal pads 300, 400 therefore do not need to be arranged within the outline of the semiconductor chip 110, but may be distributed over a larger area. Without saying, in many semiconductor chips 110, e.g., logic circuits, microcontrollers, etc., a high number of chip electrodes are necessary, and thus, a high terminal count (often referred to as "pin count") of the packet is required. Fan-out type packages such as chip packages 100, 200 provide increased area available for the arrangement of the (external) package terminal pads 300, 400. To this end, at least one lateral dimension of the package substrate 120 is greater than the corresponding lateral dimension of the semiconductor chip 110.

In other examples the chip packages considered herein may be fan-in type packages. In fan-in type packages all terminal pads 300, 400 are arranged within the outline of the semiconductor chip 110. Further, each lateral dimension of the package substrate 120 may, e.g., be equal or smaller than the corresponding lateral dimension of the semiconductor chip 110. By way of example, chip package 100 may be realized as a fan-in type package if the package substrate 120 is laterally confined to not extend beyond the outline of the semiconductor chip 110.

As mentioned above, packages considered herein may, e.g., be so-called bare die packages. By way of example, package 100 as well as package 200 as illustrated in FIGS. 5A and 5B are referred to as bare die packages.

Packages considered herein may, e.g., be single-chip packages. By way of example, the chip packages 100, 200 illustrated in FIGS. 5A and 5B are examples of single-chip packages.

Packages considered herein may, e.g., be chip-scale packages (CSP) and/or wafer-scale packages (WSP). A CSP is defined herein as a package whose lateral dimensions are less than 1.5 times that of the bare semiconductor chip 110. Thus, both packages 100, 200 described above may, e.g., be CSPs. Further, package 200 may be a WSP if manufactured by wafer-level packaging (WLP) technology.

Packages considered herein may, e.g., be wire-bond packages. Wire-bond packages as referred to herein are packages having a common terminal surface which contains all (external) terminals pads of the package, and wherein the terminal pads are configured such that electrical contact to an application board is exclusively done by wire-bonding.

The reinforcing structure used herein allows that packages considered herein are tested by the package manufacturer before being shipped to the customer. In the following, package-level testing processes are considered. One type of a package-level testing process is referred to as a burn-in test. In a burn-in test one or more chip packages are individually disposed in corresponding test sockets of a burn-in board and the contact pins in the burn-in sockets will make electrically connections with the (external) terminal pads of the chip packages. The packages under test are then exposed to an elevated temperature environment and components of the package are exercised by applying input biases to simulate semiconductor chip operation for a long period of time, e.g., several hours. Burn-in test temperature may exceed 100° C. and burn-in time may be longer than, e.g., 8 or 12 hours. Thus, by applying a burn-in, early in-use system failures can be avoided at the expense of a reduced yield caused by the burn-in process. It is to be noted that a package-level burn-in test screens the entire system (i.e., the package) and thus reveals failures caused by the integrated circuit or chip as well as failures caused by a loss of electrical contact at the chip-substrate interface or within the electrical interconnect of the substrate 120 or at the terminal pads. Such failures may, e.g., be caused by different CTE (coefficient of thermal expansion) of the semiconductor chip 110 and the package substrate 120 or may also be caused by defective burn-in test sockets.

Another type of a package-level testing process is referred to herein as a functional test. In a functional test a chip package is disposed in a test socket for performing the functional test. In a functional test structure and functionality of the chip is tested. The test duration per chip package is only a few seconds, i.e., many orders of magnitude shorter than test duration of a burn-in test. Typically, different test sockets are used for the burn-in test and the functional test.

Performing a burn-in test on package-level may significantly reduce costs compared to the process of performing a burn-in test on wafer-level. By way of example, the cost of a burn-in equipment to perform a burn-in on wafer level may be about $500,000 U.S. or more whereas the cost of a burn-in test socket may be about $5 to $50 U.S. Although a high number of burn-in test sockets are needed, the overall costs are reduced when performing a burn-in on package-level.

FIG. 6 illustrates an exemplary burn-in test socket 600 which may be used in a package-level burn-in test. A chip package such as, for example, chip package 200 may be inserted in the burn-in test socket 600. The burn-in test socket 600 may, e.g., comprise a socket body 601 and a plurality of contacts 602 received in the socket body 601. Further, the burn-in test socket 600 may comprise a lid 603 movably mounted at the socket body 601. By way of example, the lid 603 may, e.g., be pivotally supported on the socket body 601 at reference numeral 603a and may be open by a movement along arrow P. In FIG. 6 the lid 603 is closed. The chip package 200 is inserted in a recess of the socket body 601. A part or all of the terminal pads 300 of the first group of terminal pads are in contact with corresponding contacts 602 of the burn-in test socket. Thus, the contacts 602 of the burn-in test socket are aligned to the terminal pads 300 of the first group of terminal pads. By way of example, as to the second group of terminal pads 400, the burn-in test socket does not contain contacts to make electrical connections to these terminals.

FIG. 7 illustrates a test socket 700 for a functional test on package-level. Test socket 700 for a functional test may comprise a socket body 701, a removable lid 703, e.g., pivotally hinged at the socket body 701 at reference numeral 703a and contacts 704. In view of the socket body 701 and the lid 703, the test socket 700 for a functional test is similar to the burn-in test socket 600 and reference is made to the corresponding disclosure to avoid reiteration. Contacts 704, however, are operatively connected to the terminal pads 400 of the second group of terminal pads of the chip package 200. With regard to the terminal pads 300 of the first group of terminal pads, it may be the case that the test socket 700 for a functional test does not have any contacts to make electrical contact to these terminals. In another example as illustrated in FIG. 3, contacts 702 may be received in the socket body 701 to make electrical contact to at least a part of the terminal pads 300 of the first group of terminal pads.

Thus, during burn-in testing exclusively terminal pads 300 of the first group of terminal pads are contacted. On the other hand, during functional testing terminal pads 400 of the second group of terminals are contacted and, optionally, a part or possible all of the terminal pads 300 of the first group of terminals are contacted.

Terminal pads 300 of the first group of terminal pads may have a form factor which is different from the form factor of terminal pads 400 of the second group of terminal pads. As used herein, the meaning of the expression "form factor" of terminal pads comprises the pad size and/or the pitch of terminal pads. That is, the pad size of a terminal pad 300 of the first group of terminal pads may be greater than the pad size of a terminal pad 400 of the second group of terminal pads. Further, a pitch between terminal pads 300 of the first group of terminal pads may be greater than a pitch between terminal pads 400 of the second group of terminal pads.

As mentioned above, the reinforcing structure (e.g., substrate 120 and/or lateral encapsulant 500) allows to envisage package-level burn-in testing. Further, the difference in the form factors associated with the first and second groups of terminal pads 300, 400 allows to significantly reduce the cost of a burn-in test socket, e.g., burn-in test socket 600. In contrast to the conventional approach of package burn-in testing, where all terminal pads used for burn-in testing and for functional testing have same parameters in view of pad size, pitch, etc., the disclosure herein allows to exclusively use terminal pads of a relaxed form factor (e.g., pad size, pitch) during burn-in testing and to use terminal pads of a "tighter" form factor during functional testing.

This concept allows to reduce the costs of a burn-in test socket because the larger the pad-size and/or the greater the pitch, the cheaper is the burn-in socket. Further, the reliability of the electrical contact between the contacts 602 and the terminal pads 300 of the chip package 200 during burn-in test is improved. This reduces the probability of burn-in test failures caused by electrical contact problems between the socket 600 and the package 200 during the long duration of a burn-in test in an oven. Further, since the electrical contact tolerances between the burn-in test socket 600 and the chip package 200 are increased, the burn-in test sockets 600 may have a longer lifetime compared to conventional burn-in test sockets having the standard (i.e., smaller) pitch and/or a pad size dimension.

As concerns the test socket 700 for performing the functional test, contact parameters such as terminal pad size and/or pitch of the terminal pads 400 of the second group of terminal pads may be significantly smaller than the corresponding parameters of the terminal pads 300 of the first group of terminal pads. However, as mentioned before, the number of burn-in test sockets 600 needed at the manufacturer is much higher than the number of test sockets 700 for performing the short duration functional testing. Therefore, using fine contact parameters for pad size or pitch (i.e., tight form factors) is more acceptable for functional testing than for burn-in testing in view of costs.

Generally speaking, the package-level test flow comprising at least the burn-in test and, optionally, the functional test may be mapped to the terminal pad design of the common terminal surface of the package. Whilst terminal pads 300 having a relaxed form factor are available during burn-in testing, terminal pads 400 having a comparatively shrinked form factor are used during functional testing.

Figure 8:
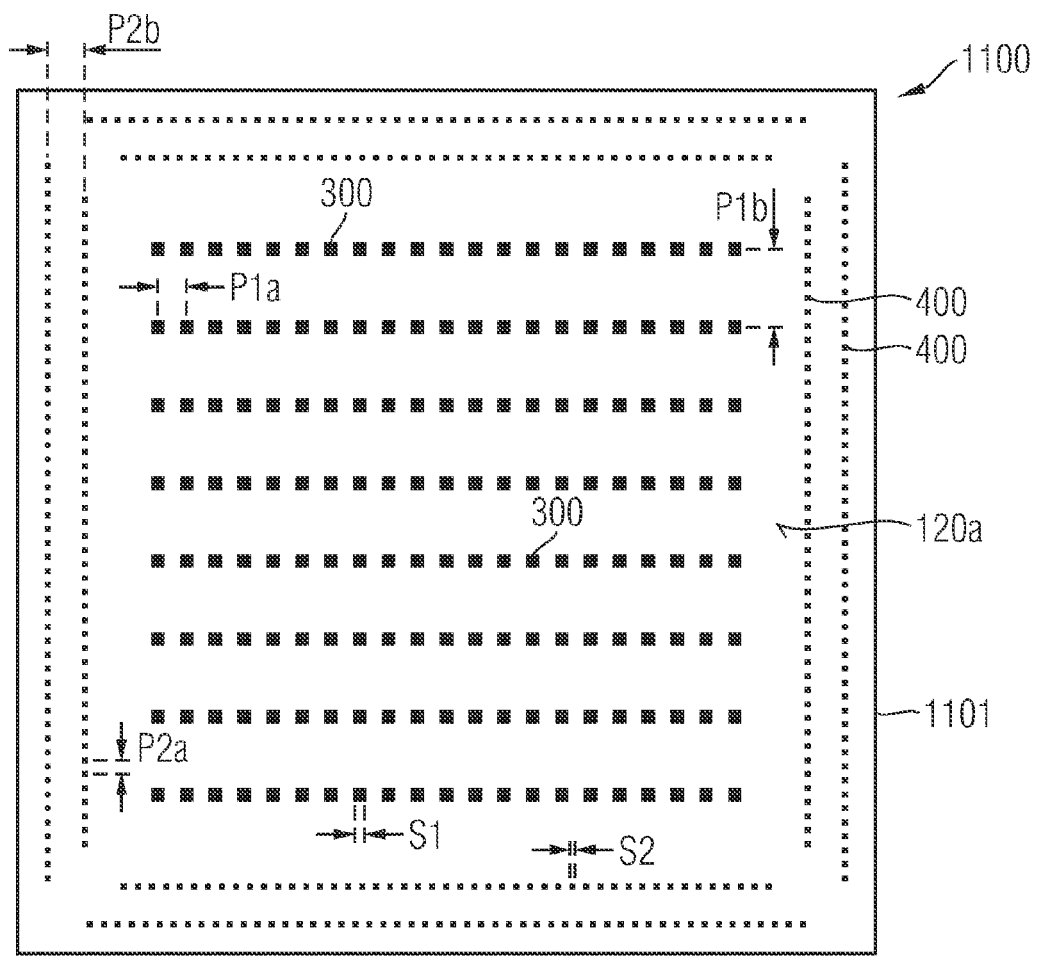
FIG. 8 illustrates an example of a layout of a terminal surface of an exemplary chip package.

FIG. 8 illustrates an example of a terminal surface layout 1100 of an exemplary chip package such as, e.g., chip package 100 or 200. FIG. 8 is a top view on the upper surface 120a of the package substrate 120. An outline 1101 of the terminal surface layout 1100 may be defined by the outline of the package substrate 120. In this example, the terminal pads 300 of the first group of terminal pads are arranged in a first array and the terminal pads 400 of the second group of terminal pads are arranged in a second array. Here, the first array defines a first terminal region on the common terminal surface 120a and the second terminal array defines a second terminal region on the common terminal surface 120a of the package. In FIG. 8, by way of example, the first terminal region is an inner region of the common terminal surface 120a which is completely surrounded by the second terminal region. The first terminal region may, e.g., be a contiguous region, e.g., a contiguous region having a rectangular or quadratic shape. The second terminal region may, e.g., also be a contiguous region as, e.g., shown in FIG. 8. By way of example, the second terminal region is arranged in a peripheral region of the terminal surface layout 1100 adjacent to the outline 1101 thereof. The second terminal region may be arranged adjacent to the entire outline 1101 of the terminal surface layout 1100. The second terminal region may completely surround the first terminal region. The first terminal region and the second terminal region are, e.g., separated from each other, i.e., they do not overlap. Other possible designs and variations thereof are also possible.

The first array of first terminal pads 300 may be organized in rows and/or columns. Column spacing and row spacing may define pitches P1a and P1b, respectively. Referring to the second terminal pads 400 arranged in the second array of second terminal pads 400, pitches P2a and P2b between terminal pads 400 of the second group of terminal pads may be defined in a similar fashion.

Further, a pad size S1 of a terminal pad 300 of the first group of the terminal pads and a pad size S2 of a terminal pad 400 of the second group of terminal pads may be defined. The corresponding pad sizes S1 and S2 are the lateral dimension of the corresponding terminal pads 300, 400. In FIG. 8, by way of example, the terminal pads 300, 400 have the shape of a square. If the terminal pads 300, 400 are shaped differently, S1 and S2 may relate to a diameter, a minimum lateral dimension, etc.

Pad pitches and pad sizes may e.g. be as follows. Terminal pads 300 of the first group of terminal pads (burn-in test pads) may have the following dimensions:

500 μm≤P1a≤1000 μm and/or 500 μm≤P1b≤1000 μm,
200 μm≤S1≤600 μm.

The pitch P1a, P1b of each terminal pad 300 may be greater than 500 more particularly greater than 600 still more particularly greater than 700 μm or even 800 μm. The pad size S1 of each terminal pad 300 may be greater than 200 more particularly greater than 300 and still more particularly greater than 400 μm or even 500 μm. By way of example, a pitch P1a and/or P1b may be about 800 μm and, by way of example, a pad size S1 may be about 500 μm.

Terminal pads 400 of the second group of terminal pads (test pads for the functional test) may have the following dimensions:

200 μm≤P2a≤400 μm and/or 200 μm≤P2b≤400 μm,
150 μm≤S2≤250 μm.

The pitch P2a, P2b of each terminal pad 400 may be smaller than 400 more particularly smaller than 300 μm or 250 μm. The pad size S2 of each terminal pad 400 may be smaller than 250 more particularly smaller than 200 μm. By way of example, the pitch P2a and/or P2b may be about 300 μm and, by way of example, a pad size S2 may be about 170 μm.

Here and in the other embodiments a number of, e.g., 20-60 terminal pads 300 of the first group of terminal pads (e.g., burn-in test pads) may be provided. These terminal pads 300 may comprise I/O (input/output) terminal pads and power supply pads. As an specific example, a total number of, e.g., about 30 terminal pads 300 of the first group of terminal pads may be provided.

Here and in the other embodiments a number of 100-180 terminal pads 400 of the second group of terminal pads may be provided. By way of example, all terminal pads 400 may be I/O terminal pads. In this case, power supply during the functional test is supplied via some of the terminal pads 300 of the first group of terminal pads (see, e.g., FIG. 7). By way of example, in addition to the terminal pads 400 of the second group of terminal pads, a number, e.g., 10-25, of terminal pads 300 of the first group of terminal pads may be contacted during package-level functional testing. It is also possible that all terminal pads 300 of the first group of terminal pads that are contacted during functional testing are power supply pads. As a specific example, a number, e.g., about 140 I/O, of terminal pads 400 of the second group of terminal pads and a number, e.g., about 20 of power supply terminal pads 300 of the first group of terminal pads may be contacted during functional testing.

More specifically, in the above example the common terminal surface 120 may comprise, e.g., 30 terminal pads 300 of the first group of terminal pads (I/O pads and power supply pads) and, e.g., 140 terminal pads 400 of the second group of terminal pads (I/O pads only). The package-level burn-in test (see FIG. 6) may use all, e.g., 30 terminal pads 300 and the functional test may use a part, e.g., 20, of terminal pads 300 (power supply pads only) and, e.g., all 140 terminal pads 400 (I/O pads only).

As mentioned before terminal pads 400 of the second group of terminal pads may be arranged close to one or a plurality of edges (corresponding to outline 1101) of the common terminal surface 120*a*. By way of example, terminal pads 400 may be arranged in two to four parallel rows running along one or more of the plurality of edges. In FIG. 8, by way of example, the terminal pads 400 are illustrated to run in, e.g., two parallel rows close to all four edges of the common terminal surface 120*a*.

Figure 9A:
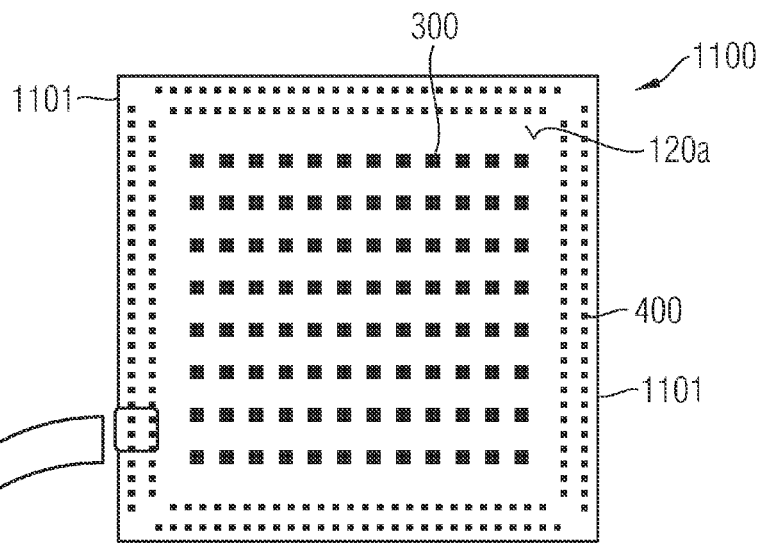
FIG. 9A illustrates the example of a layout of a terminal surface of an exemplary chip package of FIG. 8.
Figure 9B:
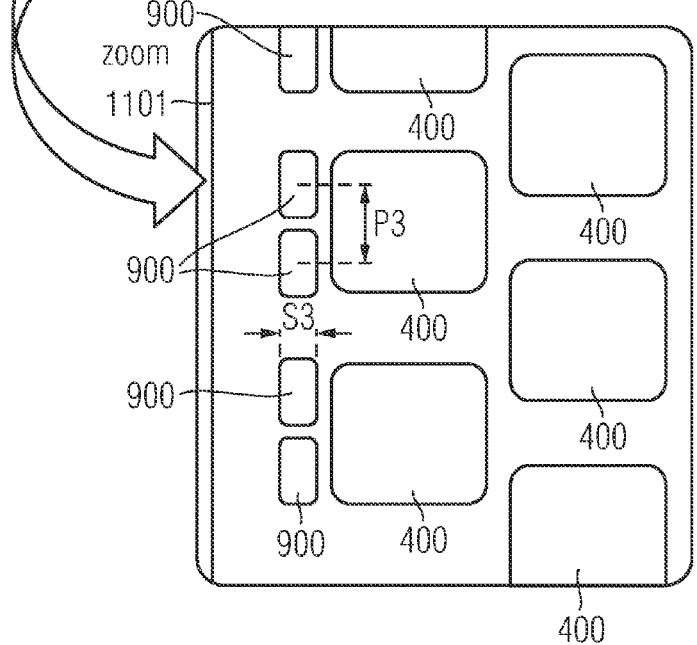
FIG. 9B illustrates a detail of the layout of a terminal surface of the exemplary chip package of FIG. 9A.

Further, in addition to the terminal pads 300 of the first group of terminal pads and, optionally, the terminal pads 400 of the second group of terminal pads, terminal pads 900 of a third group of terminal pads of the chip package may be provided on the common terminal surface 120*a* of the chip package disclosed herein. FIG. 9B illustrates a detail of FIG. 9A, the latter being identical to FIG. 8. The detail of FIG. 9B illustrates an enlarged edge portion of terminal surface layout 1100. It is to be noted that FIG. 9B is applicable to all packages and terminal surface layouts 1100 to 1500 thereof and, more generally, to all common terminal surfaces considered herein. Terminal pads 900 of the third group of terminal pads may have a pitch P3 and a pad size S3.

Pad pitches and pad sizes may, e.g., be as follows. Terminal pads 900 of the third group of terminal pads may have the following dimensions:

5 μm≤P3≤150 μm,
40 μm≤S3≤120 μm.

The pitch P3 of each terminal pad 900 may be smaller than 150 μm, more particularly smaller than 120 μm or 100 μm. Pad size S3 of each terminal pad 900 may be smaller than 150 μm, more particularly smaller than 100 μm. Pad size S3 of a terminal pad 900 may be smaller than a pad size S2 of a terminal pad 400. By way of example, pitch P3 may, e.g., be about 100 μm. By way of example, pad size S3 may, e.g., be 60×100 μm.

The terminal pads 900 of the third group of terminal pads are may be arranged in a third array the outline thereof defining a third terminal region on the common terminal surface 120*a* of the package, the first terminal region and third terminal region may be separated from each other, i.e., are non-overlapping. Further, the third terminal region may partly or completely surround the first terminal region. As illustrated in FIG. 9B, terminal pads 900 of the third group of terminal pads may, e.g., be located in one or more most outer rows. That is, terminal pads 900 of the third group of terminal pads may be located in a region between the outline 1101 of the common terminal surface 120*a* and the outermost row of terminal pads 400 of the second group of terminal pads.

All terminal pads 900 of the third group of terminal pads may be terminal pads used for board-level system integration, e.g., wire-bond pads. In particular, terminal pads 900 of the third group of terminal pads may partly or exclusively be power supply pads. Such power supply pads are wire-bonded down to supply rails on an customer's application board 800, see FIG. 10.

By way of example, a number of 50 to 100 terminal pads 900 of the third group of terminal pads may be provided. For example, these terminal pads 900 may all be power supply pads. In the specific example described above, e.g., 140 terminal pads 400, which may, e.g., be exclusively I/O pads, and, e.g., 70 terminal pads 900, which may, e.g., be exclusively power supply pads, may be provided on the common terminal surface 120 and electrically connected to the application board 800 by, e.g., bonding wires.

Figure 10:
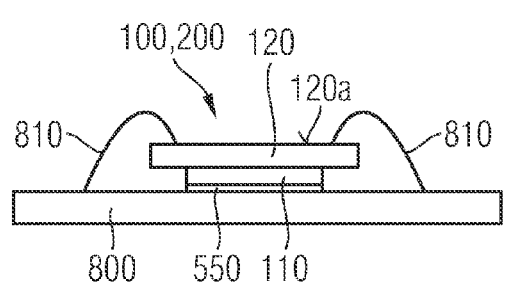
FIG. 10 illustrates an example of a chip package mounted on an application board by wire-bonding.

By way of example, as illustrated in FIG. 10, a chip package such as, e.g., chip package 100, 200 may be bonded to an application board 800. The chip packages 100, 200 may be mounted on the customer's application board 800, e.g., a PCB, the same way as a bare die. For that reason, the chip package 100, 200 is referred to as a bare die package. That is, an adhesive 550 may be used to glue the chip package 100, 200 to a mounting surface of the application board. The adhesive 550 may be designed as a thin layer located between and, e.g., in direct contact to the lower surface 110b of the semiconductor chip 110 and the mounting surface of the application board. The adhesive 550 may have a high thermal conductivity to provide the same advantages as known in the technology of bare die mounting.

FIG. 10 further illustrates a process of wire-bonding to electrically connect the chip package 100, 200 to the application board 800. In this case, wire-bonds 810 are drawn from terminal pads on the common terminal surface 120a of the chip package 100, 200 to electrical circuits or interconnect structure of the application board 800. The mounting surface of the application board and the interconnect structure of the application board to which electrical contact via wire-bonding is made may, e.g., be made of the same structured metal layer (not shown) at the top of the application board 800. Electrical contact of the chip package 100, 200 to the application board 800 by bond-wires and thermal contact of the chip package 100, 200 to the application board 800 at the exposed backside 110b of the semiconductor chip 110 may thus be made by the same structure and/or at the same level of the application board 800. By way of example, the application board 800 may be a PCB or a ceramics substrate coated with a structured metal layer, e.g., a DCB. FIG. 10 illustrates by way of example a wire-bond system integration of a bare die package 100, 200, which is typically performed by the customer after shipping the semiconductor package 100, 200 to the customer.

By way of example, terminal pads 300 of the first group of terminal pads are not intended for board-level system integration, i.e., no terminal pad 300 is wire-bonded in the example of FIG. 10. Thus, these pads 300 may be configured exclusively as test pads, in particular as mere burn-in pads or as burn-in pads and test pads for the functional test (see FIG. 7).

Terminal pads 400 of the second group of terminal pads may be used as wire-bond pads, either a part thereof or all. By way of example, in terminal surface layout 1100, all terminal pads 400 may be used as wire-bond pads, whereas in other terminal surface layouts, only terminal pads arranged close to an edge of the common terminal surface 120a may be used as wire-bond pads.

Terminal pads of the chip package which are used for board-level system integration (i.e., for electrical connection to the application board) as described above must not be wire-bonding pads. Board-level system integration may also be performed by other techniques such as, e.g., soldering, ultrasonic bonding, conductive gluing, sintering, etc. In this case, the terminal pads of the chip package used for board-level system integration are configured for one of these bonding techniques.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing and testing a chip package, the method comprises:
   producing the chip package, wherein the chip package comprises a semiconductor chip containing an integrated circuit and a reinforcing structure attached to the semiconductor chip, wherein the chip package has a lower main face and an upper main face opposite to the lower main face, wherein the lower main face is at least partly formed by an exposed surface of the semiconductor chip and the upper main face is formed by a terminal surface of the reinforcing structure on which a first group of external terminal pads of the chip package and a second group of external terminal pads of the chip package are arranged, wherein a pad size of an external terminal pad of the first group of external terminal pads is greater than a pad size of an external terminal pad of the second group of external terminal pads; and
   after producing the chip package, performing a functional test of the chip package on package-level; and
   performing a package-level burn-in test.

2. The method of claim 1, wherein the lower main face is formed by a protection layer.

3. The method of claim 1, further comprising performing a previous functional test of the integrated circuit on wafer-level.

4. The method of claim 1, wherein producing the chip package comprises:
   processing a wafer to generate integrated circuits;
   separating the wafer into semiconductor chips; and
   attaching the reinforcing structure to the semiconductor chip.

5. The method of claim 4, wherein attaching the reinforcing structure comprises:
   placing at least two semiconductor chips on a temporary carrier in a spaced apart relationship; and
   applying an encapsulating material between the at least two semiconductor chips to form an encapsulant.

6. The method of claim 5, wherein attaching the reinforcing structure further comprises applying an electrical redistribution structure to the at least two semiconductor chips and the encapsulant.

7. The method of claim 6, wherein applying the electrical redistribution structure comprises applying a metal layer to the semiconductor chip and the encapsulating material with the metal layer being electrically coupled to electrodes of the semiconductor chip.

8. The method of claim 7, further comprising structuring the metal layer to form terminal pads of the chip package.

9. The method of claim 8, wherein the metal layer is structured to form the first group of terminal pads of the chip package and the second group of terminal pads of the chip package, wherein a pitch between terminal pads of the first group of terminal pads is greater a pitch between terminal pads of the second group of terminal pads.

10. The method of claim 1, wherein performing the package-level burn-in test comprises placing the chip package in a burn-in test socket, wherein a plurality of first electrical contacts are received in the burn-in test socket and the first electrical contacts make electrical connections to terminal pads of the first group of terminal pads.

11. The method of claim 1, further comprising, after producing the chip package, performing a second functional test of the chip package on package-level, wherein performing the second functional test comprises placing the chip package in a functional test socket, wherein a plurality of second electrical contacts are received in the functional test socket and the second electrical contacts make electrical connections to at least one terminal pad of the first group of terminal pads and a plurality of terminal pads of the second group of terminal pads.

12. The method of claim 8, wherein the metal layer is structured to form a third group of terminal pads of the chip package, wherein a pad size of a terminal pad of the third group of terminal pads is smaller than the pad size of the terminal pad of the second group of terminal pads.

13. The method of claim 8, wherein the metal layer is structured to form a third group of terminal pads of the chip package, wherein a pitch between terminal pads of the third group of terminal pads is smaller than a pitch between terminal pads of the second group of terminal pads.

14. The method of claim 13, wherein the terminal pads of the third group of terminal pads are wire-bonding terminal pads.

15. The method of claim 1, wherein the pad size of each terminal pad of the first group of terminal pads is greater than 200 μm.

16. The method of claim 1, wherein the pad size of each terminal pad of the second group of terminal pads is smaller than 250 μm.

17. A method of producing and testing a chip package, the method comprises:
    producing the chip package, wherein the chip package comprises a semiconductor chip containing an integrated circuit and a reinforcing structure attached to the semiconductor chip, wherein the chip package has a lower main face and an upper main face opposite to the lower main face, wherein the upper main face is formed by a terminal surface of the reinforcing structure on which external terminal pads of the chip package are arranged, wherein at least some of the external terminal pads are wire-bonding terminal pads configured to wire-bond the chip package to an external device; and
    performing a package-level burn-in test.

18. The method of claim 17, wherein the lower main face of the chip package is at least partly formed by an exposed surface of the semiconductor chip.

19. The method of claim 17, wherein the chip package is a single-chip package.

20. The method of claim 17, wherein the chip package is a multi-chip package.

21. The method of claim 17, wherein the chip package is a wafer-level package.

22. A method of producing and testing a chip package, the method comprises:
    producing the chip package, wherein the chip package comprises a semiconductor chip containing an integrated circuit and a reinforcing structure attached to the semiconductor chip, wherein the chip package has a lower main face and an upper main face opposite the lower main face, wherein the lower main face is at least partly formed by an exposed surface of the semiconductor chip and the upper main face is formed by a terminal surface of the reinforcing structure on which a first group of external terminal pads of the chip package and a second group of external terminal pads of the chip package functionally different from the first group are arranged; and
    after producing the chip package, performing a functional test of the chip package on package-level, wherein performing the functional test comprises placing the chip package in a functional test socket wherein a plurality of second electrical contacts are received in the functional test socket and the second electrical contacts make electrical connections to at least one external terminal pad of the first group of external terminal pads and a plurality of external terminal pads of the second group of external terminal pads; and
    performing a package-level burn-in test, wherein performing the package-level burn-in test comprises placing the chip package in a burn-in test socket, wherein a plurality of first electrical contacts are received in the burn-in test socket and the first electrical contacts make electrical connections to external terminal pads of the first group of external terminal pads.

* * * * *